United States Patent
Kim et al.

(10) Patent No.: US 9,502,593 B2
(45) Date of Patent: Nov. 22, 2016

(54) ORGANIC LIGHT-EMITTING DIODE (OLED) DISPLAY

(71) Applicant: Samsung Display Co., Ltd., Yongin, Gyeonggi-Do (KR)

(72) Inventors: Sungho Kim, Yongin (KR); Jongmoo Huh, Yongin (KR)

(73) Assignee: Samsung Display Co., Ltd., Gyeonggi-Do (KR)

(*) Notice: Subject to any disclaimer, the term of this patent is extended or adjusted under 35 U.S.C. 154(b) by 0 days.

(21) Appl. No.: 14/609,099

(22) Filed: Jan. 29, 2015

(65) Prior Publication Data
US 2016/0064460 A1 Mar. 3, 2016

(30) Foreign Application Priority Data
Sep. 1, 2014 (KR) .................. 10-2014-0115401

(51) Int. Cl.
| | |
|---|---|
| *H01L 29/08* | (2006.01) |
| *H01L 35/24* | (2006.01) |
| *H01L 51/00* | (2006.01) |

(Continued)

(52) U.S. Cl.
CPC ....... *H01L 31/02327* (2013.01); *H01L 27/326* (2013.01); *H01L 27/3269* (2013.01); *H01L 2251/533* (2013.01)

(58) Field of Classification Search
CPC ........... H01L 27/3269; H01L 27/1214; H01L 27/3272; H01L 2251/5315; H01L 27/14665; H01L 27/3227; H01L 27/3244; H01L 27/3262; H01L 51/5271; H01L 28/60; H01L 29/786; H01L 27/3248; H01L 31/02327; H01L 51/5218; H01L 51/5221
USPC .............. 257/40, 59, 72, E27.111, E33.001, 257/E51.022, 292, 294, 290, 291, 80, 443, 257/458, 53, E27.133, E29.336; 438/22, 438/29, 30; 345/76
See application file for complete search history.

(56) References Cited

U.S. PATENT DOCUMENTS

| | | |
|---|---|---|
| 2004/0188687 A1 | 9/2004 | Arnold et al. |
| 2007/0024547 A1 | 2/2007 | Jang et al. |
| 2007/0273292 A1 | 11/2007 | Choi et al. |

(Continued)

FOREIGN PATENT DOCUMENTS

| | | |
|---|---|---|
| JP | 2007-273985 A | 10/2007 |
| JP | 2009-070977 A | 4/2009 |

(Continued)

*Primary Examiner* — Thao X Le
*Assistant Examiner* — Nduka Ojeh
(74) *Attorney, Agent, or Firm* — Knobbe Martens Olson & Bear LLP

(57) ABSTRACT

An organic light-emitting diode (OLED) display is disclosed. In one aspect, the display includes a substrate including an emission area, a sensor area, and an opening area. The display also includes an OLED formed in the emission area of the substrate, wherein the OLED includes an organic light emitting layer interposed between pixel and opposite electrodes, wherein the opposite electrode is configured to firstly reflect light emitted from the intermediate layer. The display further includes a photo sensor formed in the sensor area of the substrate and a partition wall located adjacent to the photo sensor and at least partially surrounding the photo sensor. The partition wall is configured to secondly reflect at least a portion of the first reflected light, and wherein the photo sensor is configured to at least partially absorb the second reflected light.

19 Claims, 7 Drawing Sheets

(51) Int. Cl.
*H01L 31/0232* (2014.01)
*H01L 27/32* (2006.01)

(56) References Cited

U.S. PATENT DOCUMENTS

| | | | |
|---|---|---|---|
| 2009/0072247 A1* | 3/2009 | Choi | H01L 27/3269 257/79 |
| 2010/0001639 A1* | 1/2010 | Kim | H01L 27/3227 313/524 |
| 2010/0084642 A1* | 4/2010 | Hanari | H01L 27/3269 257/40 |
| 2012/0056179 A1* | 3/2012 | Lee | H01L 31/1055 257/53 |
| 2013/0032803 A1* | 2/2013 | Moon | H01L 51/5271 257/59 |
| 2014/0061605 A1 | 3/2014 | Kim et al. | |

FOREIGN PATENT DOCUMENTS

| | | |
|---|---|---|
| KR | 10-2004-0085025 A | 10/2004 |
| KR | 10-0547515 B1 | 1/2006 |
| KR | 10-2006-0100902 A | 9/2006 |
| KR | 10-2014-0030842 A | 3/2014 |

\* cited by examiner

ORGANIC LIGHT-EMITTING DIODE (OLED) DISPLAY

CROSS-REFERENCE TO RELATED APPLICATIONS

This application claims the benefit of Korean Patent Application No. 10-2014-0115401, filed on Sep. 1, 2014, in the Korean Intellectual Property Office, the disclosure of which is incorporated herein in its entirety by reference.

BACKGROUND

Field

The described technology generally relates to an organic light-emitting diode (OLED) display.

Description of the Related Technology

Displays generate an image via selective light emission from a matrix of pixels, and recently, an OLED display has been highlighted as an important display technology.

An OLED display is self-emissive, unlike a liquid crystal display device, and thus has a reduced thickness and weight. Also, OLED technology has high quality characteristics such as low power consumption, high brightness, and a fast response time.

SUMMARY OF CERTAIN INVENTIVE ASPECTS

One inventive aspect is a bottom emission type OLED display.

Another aspect is an OLED display which includes a substrate comprising an emission area, a sensor area, and an opening area; a thin-film transistor (TFT) formed on the substrate and comprising an active layer, a gate electrode, a source electrode, and a drain electrode; an OLED formed in the emission area of the substrate and comprising a pixel electrode connected to one of the source electrode and the drain electrode, an intermediate layer formed on the pixel electrode and comprising an organic emission layer, and an opposite electrode formed on the intermediate layer and reflecting light that is emitted from the intermediate layer such that the light emitted from the intermediate layer is externally emitted via the opening area of the substrate that is adjacent to the emission area; a photo sensor formed in the sensor area of the substrate; and a partition wall located adjacent to the photo sensor and at least partially surrounding the photo sensor. A portion of the light that is reflected from the opposite electrode is reflected again from the partition wall and then absorbed by the photo sensor.

The emission area and the opening area may not overlap each other.

Both the pixel electrode and the opposite electrode may be reflective electrodes.

The photo sensor may be located below a gate insulating layer.

The photo sensor may include a lower electrode; a light-absorbing layer formed on the lower electrode; and an upper electrode formed on the light-absorbing layer.

The lower electrode may be larger in area than the light-absorbing layer.

The lower electrode may include a reflective metal material reflecting a portion of light that travels toward the photo sensor after being emitted from the intermediate layer toward the light-absorbing layer.

The upper electrode may be located on a same layer as the active layer of the TFT.

The active layer may include a channel region, a source region and a drain region, the source region and the drain region may be formed respectively on both sides of the channel region and are doped with ion impurities, and the upper electrode may be formed from the same material layer as the source region and the drain region of the active layer.

The lower electrode may be located on the same layer as the gate electrode and formed from the same material as the gate electrode.

The partition wall may include a first partition wall layer; and a second partition wall layer formed on the first partition wall layer.

The first partition wall layer may be located on the same layer as the gate electrode of the TFT, and formed from the same material as the gate electrode of the TFT. The second partition wall layer may be located on the same layer as the source electrode and the drain electrode, and formed from the same material layer as the source electrode and the drain electrode.

The sensor area may be formed adjacent to the opening area. The sensor area and the opening area may be formed on both sides of the emission area, respectively.

Another aspect is an organic light-emitting diode (OLED) display, comprising: a substrate comprising an emission area, a sensor area, and an opening area; a thin-film transistor (TFT) formed over the substrate and comprising an active layer, a gate electrode, a source electrode, and a drain electrode; an OLED formed in the emission area of the substrate, wherein the OLED comprises i) a pixel electrode connected to one of the source electrode and the drain electrode, ii) an intermediate layer formed on the pixel electrode and comprising an organic emission layer, and iii) an opposite electrode formed over the intermediate layer and configured to firstly reflect light emitted from the intermediate layer such that the emitted light is externally emitted via the opening area of the substrate that is adjacent to the emission area; a photo sensor formed in the sensor area of the substrate; and a partition wall located adjacent to the photo sensor and at least partially surrounding the photo sensor, wherein the partition wall is configured to secondly reflect at least a portion of the first reflected light, and wherein the photo sensor is configured to at least partially absorb the second reflected light.

In the above display, the emission area and the opening area do not overlap each other. In the above display, each of the pixel electrode and the opposite electrode is formed of a reflective material. In the above display, the photo sensor is located below a gate insulating layer. In the above display, the photo sensor comprises: a lower electrode; a light-absorbing layer formed over the lower electrode; and an upper electrode formed over the light-absorbing layer. In the above display, the lower electrode is larger in area than the light-absorbing layer. In the above display, the lower electrode is formed at least partially of a reflective metal material configured to reflect a portion of light that travels toward the photo sensor after being emitted from the intermediate layer toward the light-absorbing layer. In the above display, the upper electrode is located on the same layer as the active layer of the TFT.

In the above display, the active layer comprises a channel region, a source region and a drain region, wherein the source region and the drain region are formed respectively on both sides of the channel region and are doped with ion impurities, and wherein the upper electrode is formed from the same material layer as the source region and the drain region of the active layer. In the above display, the lower electrode is located on the same layer as the gate electrode and formed from the same material as the gate electrode. In the above display, the partition wall comprises: a first partition wall layer; and a second partition wall layer formed over the first partition wall layer. In the above display, the first partition wall layer is located on the same layer as the gate electrode of the TFT, and formed from the same material as the gate electrode of the TFT, and wherein the second partition wall layer is located on the same layer as the source electrode and the drain electrode, and formed from the same material layer as the source electrode and the drain electrode. In the above display, the sensor area is formed adjacent to the opening area. In the above display, the sensor area and the opening area are formed on both sides of the emission area, respectively.

Another aspect is an organic light-emitting diode (OLED) display, comprising: a substrate comprising an emission area, a sensor area, and an opening area; an OLED formed in the emission area of the substrate, wherein the OLED comprises a pixel electrode and an opposite electrode, and an organic light emitting layer interposed between the pixel and opposite electrodes, wherein the opposite electrode is configured to first reflect light emitted from the intermediate layer such that the emitted light is externally emitted via the opening area of the substrate that is adjacent to the emission area; a photo sensor formed in the sensor area of the substrate; and a partition wall located adjacent to the photo sensor and at least partially surrounding the photo sensor, wherein the partition wall is configured to second reflect at least a portion of the first reflected light, and wherein the photo sensor is configured to at least partially absorb the second reflected light.

In the above display, the emission area and the opening area do not overlap each other. In the above display, the photo sensor is located below a gate insulating layer. In the above display, the photo sensor comprises: a lower electrode; a light-absorbing layer formed over the lower electrode; and an upper electrode formed over the light-absorbing layer. In the above display, the partition wall comprises: a first partition wall layer; and a second partition wall layer formed over the first partition wall layer. In the above display, the photo sensor is located between the first and second partial wall layers.

DETAILED DESCRIPTION OF CERTAIN INVENTIVE EMBODIMENTS

Figure 1:
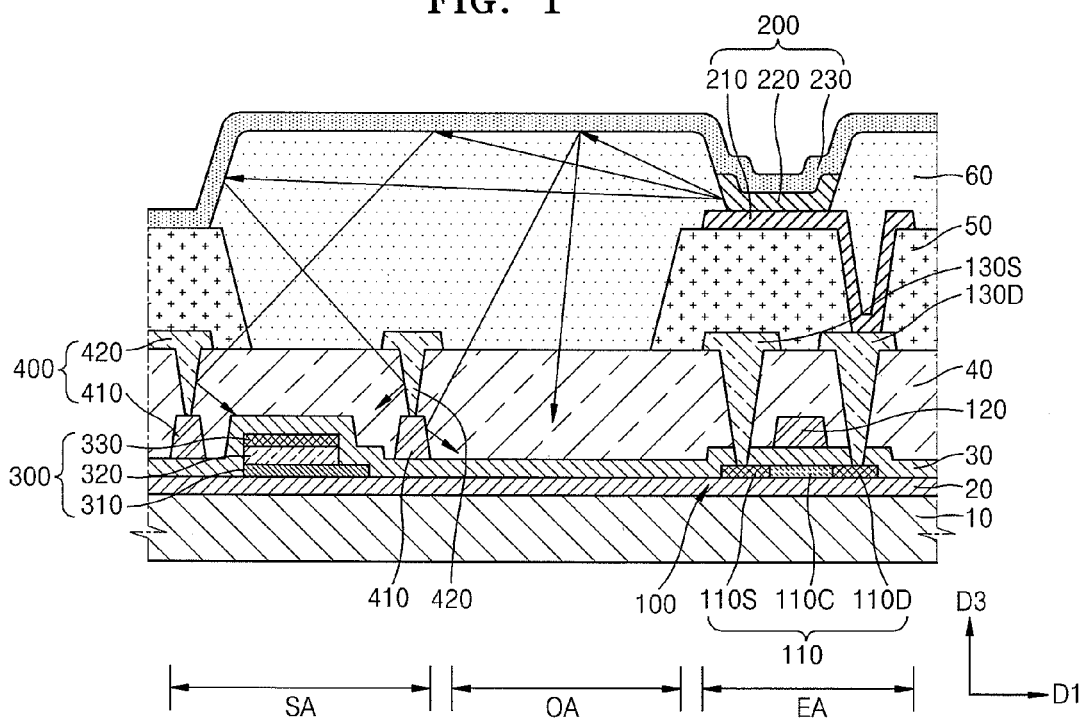
FIG. 1 is a cross-sectional side view of an organic light-emitting display apparatus according to an exemplary embodiment.

As the described technology allows for various changes and numerous exemplary embodiments, particular embodiments will be illustrated in the drawings and described in detail in the written description. The effects and features of the described technology will now be described more fully with reference to the accompanying drawings, in which exemplary embodiments are shown. The described technology may, however, be embodied in many different forms and should not be construed as being limited to the embodiments set forth herein.

Those components that are the same or are in correspondence are rendered the same reference numeral regardless of the figure number, and redundant explanations are omitted.

Throughout the specification, while such terms as "first," "second," etc., may be used to describe various components, such components must not be limited to the above terms. The above terms are used only to distinguish one component from another.

Throughout the specification, a singular form may include plural forms, unless there is a particular description contrary thereto.

It will be understood that when a layer, an area, a component, or the like is referred to as being "on" another layer, area, or component can be directly on another layer, area, or component or intervening layer, area, or component may also be present.

In the drawings, the thicknesses of layers and regions are exaggerated for clarity. For example, the thicknesses and sizes of elements in the drawings are arbitrarily shown for convenience of description, thus, the spirit and scope of the present described technology are not necessarily defined by the drawings.

Also, it should also be noted that in some alternative implementations, the steps of all methods described herein may occur out of the order. For example, two steps illustrated in succession may in fact be executed substantially concurrently or the two steps may sometimes be executed in the reverse order.

As used herein, the term "and/or" includes any and all combinations of one or more of the associated listed items. Expressions such as "at least one of," when preceding a list of elements, modify the entire list of elements and do not modify the individual elements of the list. In this disclosure, the term "substantially" includes the meanings of completely, almost completely or to any significant degree under some applications and in accordance with those skilled in the art. Moreover, "formed on" can also mean "formed over." The term "connected" includes an electrical connection.

FIG. 1 is a cross-sectional side view of an organic light-emitting display apparatus according to an exemplary embodiment.

Referring to FIG. 1, the OLED display includes a substrate 10, a thin-film transistor (TFT) 100, an OLED 200, a photo sensor 300, and a partition wall 400.

The substrate 10 may be a light-transmitting substrate formed of a glass or plastic material. The plastic material may include polyethylene terephthalate (PET), polyethylene naphthalate (PEN), or polyimide.

The substrate 10 may include an emission area EA in which the OLED 200 is arranged, an opening area OA in which light of the OLED 200 is externally emitted, and a sensor area SA in which the photo sensor 300 that measures a portion of the light of the OLED 200 is arranged.

A buffer layer 20 may be formed on the substrate 10 so as to make a planar surface and to prevent penetration of foreign substances. The buffer layer 20 may be formed as a single layer or multiple layers formed of an inorganic material such as silicon nitride and/or silicon oxide.

In the emission area EA, the OLED 200 and the TFT 100 that is electrically connected to the OLED 200 are arranged. The TFT 100 may be formed below the OLED 200 in the emission area EA.

The TFT 100 may include an active layer 110, a gate electrode 120, a source electrode 130S, and a drain electrode 130D.

The active layer 110 may be formed of a semiconductor layer including amorphous silicon or crystalline silicon. The active layer 110 includes a channel region 110C, and a source region 110S and a drain region 110D that are formed in both sides of the channel region 110C. The source region 110S and the drain region 110D are doped with ion impurities. A material of the active layer 110 is not limited to the amorphous silicon or the crystalline silicon and may include an oxide semiconductor.

The gate electrode 120 is arranged on the active layer 110 so as to correspond to the channel region 110C of the active layer 110, and a first insulating layer 30 that is a gate insulating layer is interposed between the gate electrode 120 and the active layer 110. The gate electrode 120 may be formed as a single layer or multiple layers including at least one metal selected from aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and copper (Cu).

The source electrode 130S and the drain electrode 130D that contact the source region 110S and the drain region 110D, respectively, are formed above the gate electrode 120 by having a second insulating layer 40 that is an interlayer insulating layer interposed therebetween. Each of the source electrode 130S and the drain electrode 130D may be formed as a single layer or multiple layers including at least one metal selected from Al, Pt, Pd, Ag, Mg, Au, Ni, Nd, Ir, Cr, Ca, Mo, Ti, W, and Cu.

A third insulating layer 50 that is formed on the source electrode 130S and the drain electrode 130D has a contact hole for exposing one of the source electrode 130S and the drain electrode 130D. Thus, one of the source electrode 130S and the drain electrode 130D may be electrically connected to the OLED 200 via the contact hole.

The OLED 200 includes a pixel electrode 210, an intermediate layer 220 including an organic emission layer, and an opposite electrode 230. In the present embodiment, the pixel electrode 210 and the opposite electrode 230 of the OLED 200 are all reflective electrodes, and light that is generated in the organic emission layer travels in a side direction (or, a first direction, a D1 direction, or a direction crossing or substantially perpendicular to the height of the partition wall 400) and then is externally emitted via the opening area OA of the substrate 10.

In general, only about 20% of light that is generated in an organic emission layer of a general OLED display travels in a third direction (i.e., a D3 direction) that is crossing or substantially perpendicular to the substrate 10, and a large portion of the light travels in a side direction by total internal reflection, and then disappears. That is, the light emitted from the general OLED display is only a portion of the light generated in the organic emission layer.

However, in the OLED display according to the present embodiment, both the pixel electrode 210 and the opposite electrode 230 are formed as the reflective electrodes. Therefore, light that is generated in the OLED 200 may travel in the side direction and then be externally emitted, and usage efficiency of the light may thereby be improved.

The pixel electrode 210 may be formed in a manner that a reflective layer is formed of Ag, Mg, Al, Pt, Pd, Au, Ni, Nd, Ir, Cr, AlNiLa or compound of any of these, and a layer formed of ITO, IZO, ZnO or $In_2O_3$ is formed on the reflective layer. A fourth insulating layer 60 that includes an opening for exposing a top surface of the pixel electrode 210 is formed on the pixel electrode 210, and the intermediate layer 220 is formed in the opening of the fourth insulating layer 60.

The intermediate layer 220 includes the organic emission layer including an organic material that emits red light, green light, and blue light. The organic material may be a low molecular weight or a high molecular weight organic material, and according to the organic material included in the organic emission layer, the intermediate layer 220 may further include at least one of a hole transport layer, a hole injection layer, an electron transport layer, and an electron injection layer.

The opposite electrode 230 may be formed as the reflective electrode by forming a layer including at least one material selected from Li, Ca, LiF/Ca, LiF/Al, Al, Ag, and Mg. The opposite electrode 230 can be formed not only on the intermediate layer 220 but also formed on the fourth insulating layer 60. The fourth insulating layer 60 may be projecting so as to have a slope with a predetermined degree with respect to the side direction in which the light generated in the intermediate layer 220 moves. Since the opposite electrode 230 is formed on a projecting surface of the fourth insulating layer 60, the light that is generated in the intermediate layer 220 is reflected from the pixel electrode 210 and the opposite electrode 230 and thus moves in the side direction, and then is reflected from the opposite electrode 230 formed on the projecting surface of the fourth insulating layer 60 and thus travels toward the substrate 10. The light that travels toward the substrate 10 is externally emitted, and a portion of the light that travels toward the substrate 10 is absorbed by the photo sensor 300.

The opening area OA is adjacent to the emission area EA but the opening area OA and the emission area EA do not overlap each other. Thus, although light is generated in the emission area EA in which the OLED 200 is arranged, the light is externally emitted via the opening area OA that is adjacent to the emission area EA.

The sensor area SA includes the photo sensor 300 and the partition wall 400 that at least partially surrounds the photo sensor 300.

As time goes by, the TFT 100 and/or the organic emission layer of the OLED display deteriorate, and thus brightness is lowered, such that an afterimage may occur. The larger a size of the OLED display is, and the longer the OLED display such as a television or a monitor displays a fixed image, this problem may become worse. In the present embodiment, the photo sensor 300 is formed adjacent to the emission area EA, and senses a brightness change of the OLED 200. The brightness change sensed by the photo sensor 300 is used for compensating the brightness change, so that the aforementioned problem may be solved.

The photo sensor 300 may be located below the first insulating layer 30 that is the gate insulating layer. Light that is generated in the intermediate layer 220 may disappear a little while the light passes through an inner structure, e.g., the first through fourth insulating layers 30, 40, 50, and 60 of the organic light-emitting display apparatus, and finally is externally emitted after passing through the substrate 10. Since the photo sensor 300 below the first insulating layer 30 is formed adjacent to the substrate 10 by having the buffer layer 20 interposed therebetween, the photo sensor 300 may sense the light just before emission.

The photo sensor 300 may include a lower electrode 310, a light-absorbing layer 320, and an upper electrode 330. For example, the light-absorbing layer 320 may be formed of amorphous silicon. An electric signal is generated by light that is incident on the light-absorbing layer 320, and the generated electric signal may be transferred to a compensation circuit (not shown) via the upper electrode 330 and the lower electrode 310.

The lower electrode 310 may be formed of a reflective metal material. For example, the lower electrode 310 may include metal such as Ag, Mg, Al, Pt, Pd, Au, Ni, Nd, Ir, Ti, or Cu. A size of the lower electrode 310 may be larger than a size of the light-absorbing layer 320. Since the lower electrode 310 is formed of the reflective metal material and the size of the lower electrode 310 is larger than the size of the light-absorbing layer 320, absorption efficiency of the light-absorbing layer 320 may be improved.

The upper electrode 330 may be formed from the same layer as the active layer 110 of the TFT 100. For example, the upper electrode 330 may be doped when the source region 110S and the drain region 110D are doped with impurities. Thus, the upper electrode 330 may include the same material as the source region 110S and the drain region 110D of the active layer 110.

The partition wall 400 may be located adjacent to the photo sensor 300 and may at least partially surround the photo sensor 300. If the amount of light that reaches the photo sensor 300 is small, accuracy and sensing efficiency of the photo sensor 300 may deteriorate. However, according to the present embodiment, the light is reflected by the partition wall 400 located adjacent to the photo sensor 300 and thus travels to the photo sensor 300, thus, the photo sensor 300 may have a sufficient amount of light for sensing, and the accuracy and sensing efficiency may be improved.

The partition wall 400 may include a first partition wall layer 410 and a second partition wall layer 420. The first partition wall layer 410 may be formed from the same material layer as the gate electrode 120 of the TFT 100, and the second partition wall layer 420 may be formed from the same material layer as the source electrode 130S and the drain electrode 130D of the TFT 100. The first partition wall layer 410 and the second partition wall layer 420 may contact and thus may form the partition wall 400 that extends in the D3 direction. The first partition wall layer 410 and the second partition wall layer 420 may be formed together when the TFT 100 is formed, and a separate mask may not be required in forming the first partition wall layer 410 and the second partition wall layer 420. A method therefor will be described in detail with reference to FIGS. 3A through 3F.

Figure 2A:
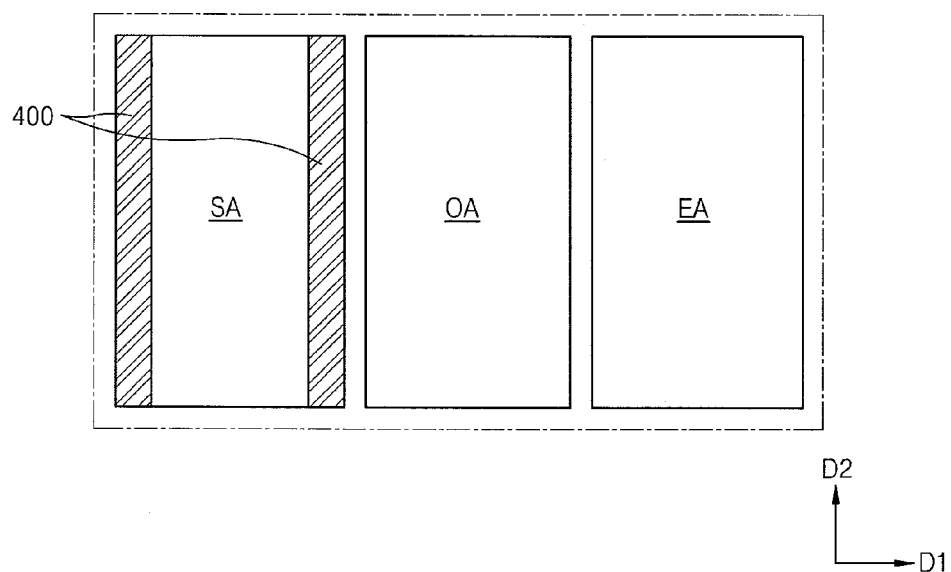
FIG. 2A is a plan view of the organic light-emitting display apparatus of FIG. 1.
Figure 2B:
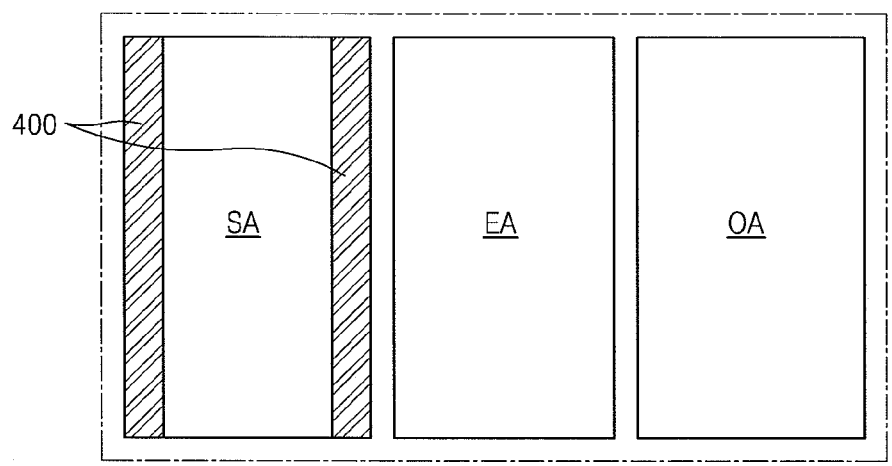
FIG. 2B is a plan view of a portion of an organic light-emitting display apparatus according to another exemplary embodiment.
Figure 2B:
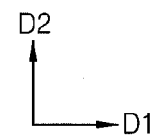

FIG. 2A is a plan view of the OLED display of FIG. 1, and FIG. 2B is a plan view of a portion of an OLED display according to another exemplary embodiment.

Referring to FIG. 2A, in the OLED display according to the present embodiment, the opening area OA may be formed adjacent to the emission area EA, and the sensor area SA may be formed adjacent to the opening area OA while the sensor area SA and the emission area EA may be formed in both sides of the opening area OA, respectively.

Referring to FIG. 2B that shows the other embodiment, in the OLED display according to the present embodiment, an opening area OA and an emission area EA may be formed adjacent to each other, and the opening area OA and a sensor area SA may be formed in both sides of the emission area EA, respectively.

According to the embodiments of FIGS. 2A and 2B, the partition walls 400 are formed to be substantially parallel with each other along some side edges of the sensor area SA. However, the described technology is not limited thereto. In another embodiment, the partition wall 400 substantially entirely surrounds all side edges of the sensor area SA and thus may form a looped curve.

FIGS. 3A through 3F are cross-sectional views related to a procedure of manufacturing the OLED display, according to an exemplary embodiment.

Figure 3A:
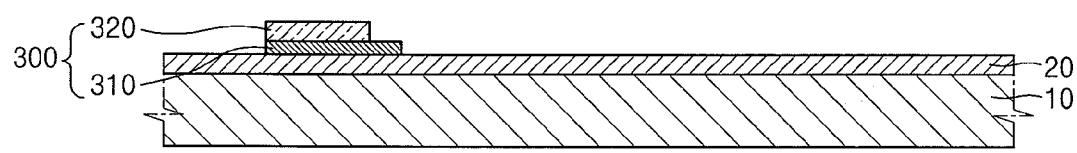
FIGS. 3A through 3F are cross-sectional views related to a procedure of manufacturing the organic light-emitting display apparatus, according to an exemplary embodiment.
Figure 3A:
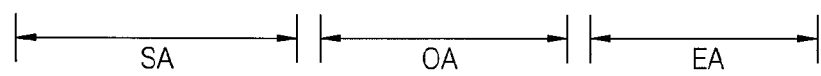

FIG. 3A is the cross-sectional view showing a first mask process and a second mask process for the OLED display.

Referring to FIG. 3A, the buffer layer 20 is formed on the substrate 10. Since the OLED display emits light via the opening area OA formed in the substrate 10, the substrate 10 is formed of a glass or plastic material having light-transmittance. The buffer layer 20 may be formed as a single layer or multiple layers formed of an inorganic material such as SiNx and/or SiOx.

Afterward, a metal layer (not shown) is formed and then is patterned so that the lower electrode 310 of the photo sensor 300 is formed in the sensor area SA (a first mask process). In an embodiment, the metal layer including Ag, Mg, Al, Pt, Pd, Au, Ni, Nd, Ir, Ti, or Cu having reflectance may be formed and patterned on the buffer layer 20, so that the lower electrode 310 of the photo sensor 300 may be formed. In order to allow the lower electrode 310 to simultaneously perform not only a function of an electrode but also a function of a reflective layer, the lower electrode 310 may be larger than the light-absorbing layer 320.

Next, an amorphous silicon layer is formed and then is patterned, so that the light-absorbing layer 320 is formed (a second mask process).

Figure 3B:
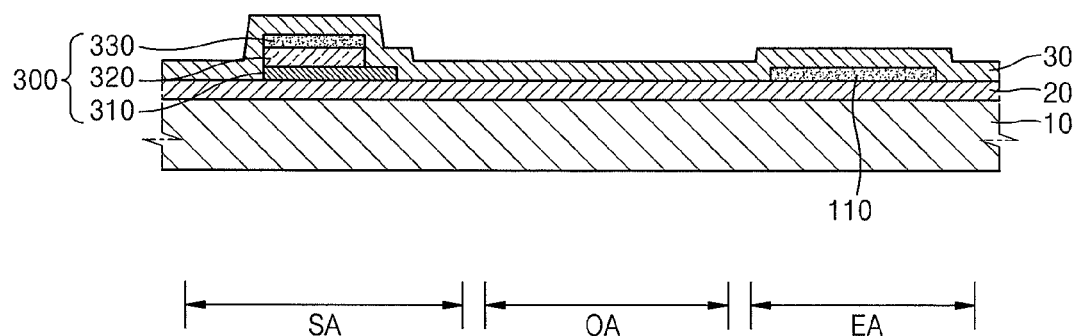

FIG. 3B is the cross-sectional view showing a third mask process for the OLED display.

Referring to FIG. 3B, a semiconductor layer (not shown) is formed and then is patterned on the substrate 10, so that the active layer 110 is formed. The active layer 110 may be formed of crystalline silicon. In another embodiment, the active layer 110 may include amorphous silicon or an oxide semiconductor.

Afterward, the first insulating layer 30 that is the gate insulating layer is formed so as to cover the upper electrode 330 of the photo sensor 300 and the active layer 110. The first insulating layer 30 may be formed of an inorganic material such as $SiO_2$, SiNx, SiON, $Al_2O_3$, $TiO_2$, $Ta_2O_5$, HfO2, $ZrO_2$, BST, or PZT.

Figure 3C:
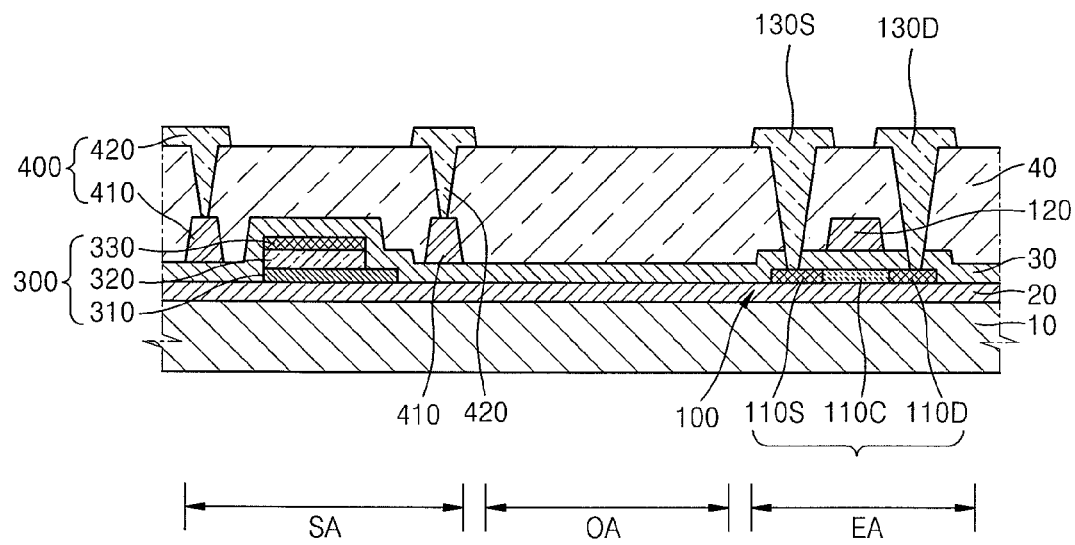

FIG. 3C is the cross-sectional view showing a fourth mask process, a fifth mask process and a sixth mask process for the OLED display.

Referring to FIG. 3C, metal layer (not shown) is formed and then patterned, so that the gate electrode 120 and the first partition wall layer 410 are formed (the fourth mask process). Each of the gate electrode 120 and the first partition wall layer 410 may be formed as a single layer or multiple layers including at least one material selected from Al, Pt, Pd, Ag, Mg, Au, Ni, Nd, Ir, Cr, Ca, Mo, Ti, W, and Cu.

Ion impurity may be doped on the aforementioned structure. In this regard, P-type ion impurity or B-type ion impurity may be doped. Since the active layer 110 is doped with the ion impurity by using the gate electrode 120 as a self-align mask, the active layer 110 includes the source region 110S and the drain region 110D that are doped with the ion impurity, and the channel region 110C that is not doped is arranged between the source region 110S and the drain region 110D.

When the active layer 110 is doped, the upper electrode 330 of the photo sensor 300 may also be doped. The upper electrode 330 may be formed from the same material layer as the source region 110S and the drain region 110D of the active layer 110. Since all of the active layer 110 and the upper electrode 330 of the photo sensor 300 are simultaneously doped via one doping process, the number of doping processes may be decreased. Also, since the upper electrode 330 of the photo sensor 300 is patterned via the same process as the active layer 110 of the TFT 100 and is doped via the same process as the active layer 110 of the TFT 100, the number of processes may be decreased.

Afterward, the second insulating layer 40 that is the interlayer insulating layer is formed and then is patterned, so that openings for exposing the source region 110S and the drain region 110D of the active layer 110, and openings for exposing the first partition wall layer 410 are formed (the fifth mask process). The second insulating layer 40 may be formed of an inorganic material such as $SiO_2$, SiNx, SiON, $Al_2O_3$, $TiO_2$, $Ta_2O_5$, $HfO_2$, $ZrO_2$, BST, or PZT.

Next, a metal layer (not shown) is formed and then is patterned, so that the source electrode 130S, the drain electrode 130D, and the second partition wall layer 420 are formed (the sixth mask process). Each of the source electrode 130S, the drain electrode 130D, and the second partition wall layer 420 may be formed as a single layer or multiple layers including at least one metal material selected from Al, Pt, Pd, Ag, Mg, Au, Ni, Nd, Ir, Cr, Ca, Mo, Ti, W, and Cu.

Figure 3D:
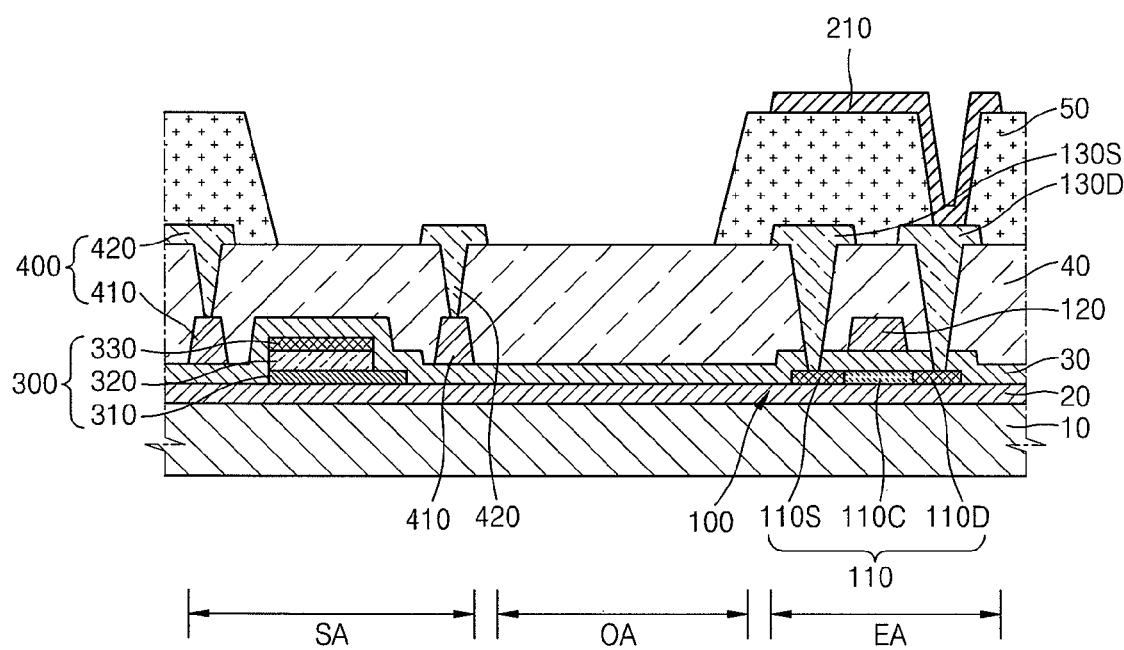

FIG. 3D is the cross-sectional view showing a seventh mask process and an eighth mask process for the OLED display.

Referring to FIG. 3D, the third insulating layer 50 is formed and then is patterned, so that one of the source electrode 130S and the drain electrode 130D is exposed (the seventh mask process). The third insulating layer 50 may include polymer derivatives having commercial polymers such as Polymethylmethacrylate (PMMA) or Polystyrene (PS), and a phenol group, an acryl-based polymer, an imide-based polymer, an arylene ether-based polymer, an amide-based polymer, a fluorine-based polymer, a p-xylene-based polymer, a vinylalcohol-based polymer, or a combination thereof.

Afterward, a reflective metal layer (not shown) is formed and then is patterned, so that the pixel electrode 210 is formed (the eighth mask process). The reflective metal layer may include a metal layer formed of Ag, Mg, Al, Pt, Pd, Au, Ni, Nd, Ir, Cr, AlNiLa or compound of any of these. Also, a layer formed of ITO, IZO, ZnO or $In_2O_3$ may be formed on the metal layer.

Referring to FIG. 3D, the third insulating layer 50 has an opening that corresponds to an opening area OA and a sensor area SA, but the described technology is not limited thereto. In another embodiment, the opening is not formed at a position that corresponds to the opening area OA and the sensor area SA.

Figure 3E:
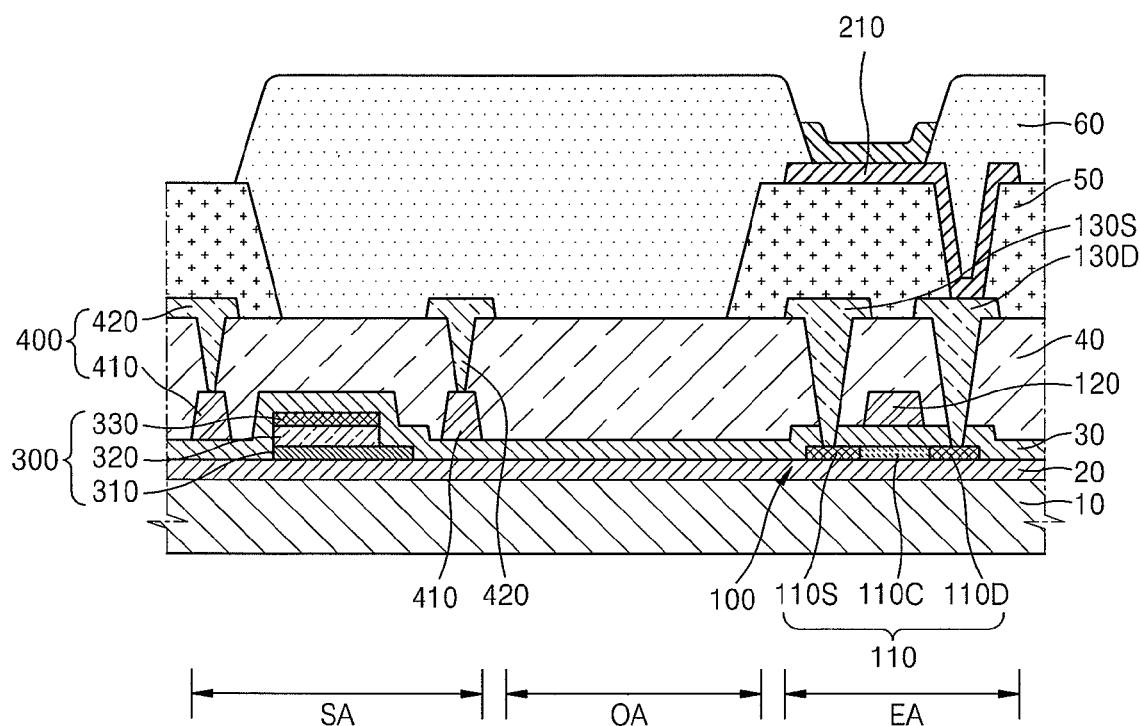

FIG. 3E is the cross-sectional view showing a ninth mask process for the OLED display.

Referring to FIG. 3E, after the fourth insulating layer 60 is formed, an opening for exposing a top surface of the pixel electrode 210 is formed in the fourth insulating layer 60. The fourth insulating layer 60 may be formed as an organic insulating layer including polymer derivatives having commercial polymers such as PMMA or PS, and a phenol group, an acryl-based polymer, an imide-based polymer, an arylene ether-based polymer, an amide-based polymer, a fluorine-based polymer, a p-xylene-based polymer, a vinylalcohol-based polymer, or a combination thereof.

Figure 3F:
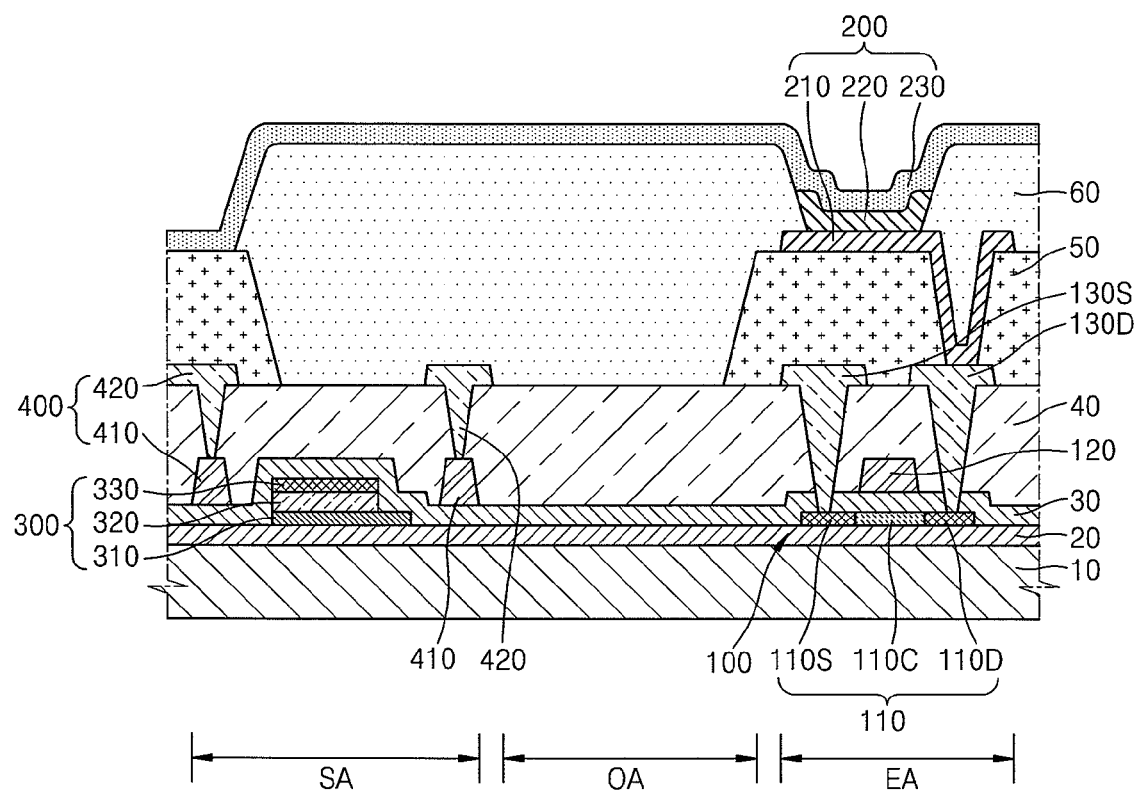

FIG. 3F is the cross-sectional view showing a process of forming the intermediate layer 220 and the opposite electrode 230 of the OLED display.

Referring to FIG. 3F, the intermediate layer 220 including the organic emission layer is formed in the opening of the fourth insulating layer 60 that exposes the top surface of the pixel electrode 210, and then the opposite electrode 230 is formed so as to cover the intermediate layer 220 and the fourth insulating layer 60. The opposite electrode 230 may have reflectance by having a layer including at least one material selected from Li, Ca, LiF/Ca, LiF/Al, Al, Ag, and Mg.

In the ninth mask process, the fourth insulating layer 60 is projecting so as to have the slope with a predetermined degree with respect to the first direction (i.e., the D1 direction) that is a substantially horizontal direction of the pixel electrode 210, and the opposite electrode 230 is formed on the projecting surface of the fourth insulating layer 60, so that light that is generated in the intermediate layer 220 is reflected between the pixel electrode 210 and the opposite electrode 230 and thus moves in the side direction, and then is reflected from the opposite electrode 230 formed on the projecting surface of the fourth insulating layer 60 and thus travels toward the substrate 10.

A large portion of the light that travels toward the substrate 10 is externally emitted via the opening area OA, and a portion of the light that travels toward the substrate 10 is directly absorbed by the photo sensor 300 or is reflected from the partition wall 400 located adjacent to the photo sensor 300 and then is absorbed by the photo sensor 300. Since the portion of the light that is reflected from the partition wall 400 is incident on the photo sensor 300, the photo sensor 300 may have a sufficient amount of light for sensing.

As described, according to the present embodiment, the upper electrode 330 of the photo sensor 300 and the first and second partition wall layers 410 and 420 of the partition wall 400 are formed while the TFT 100 is formed, so that the photo sensor 300 and the partition wall 400 may be formed without an increase in the number of mask processes.

Figure 4:
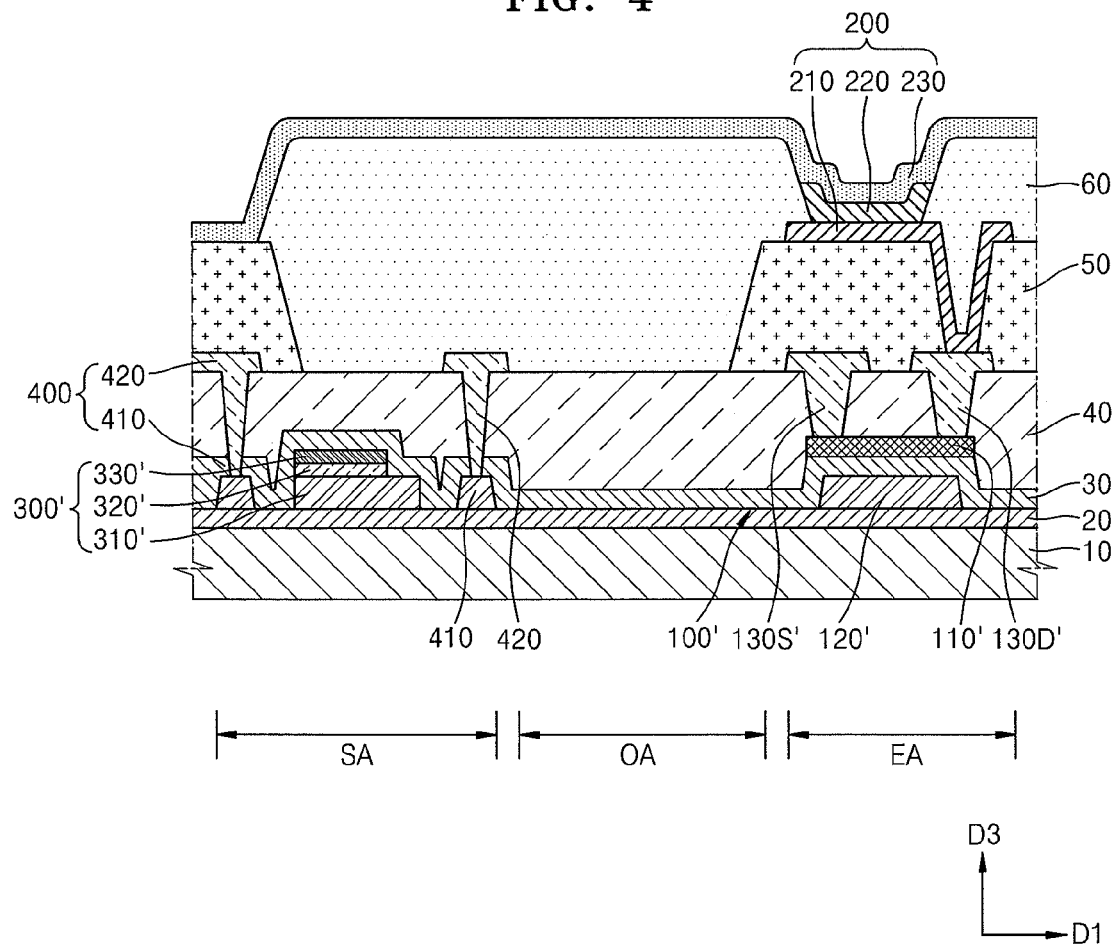
FIG. 4 is a cross-sectional view of an organic light-emitting display apparatus according to another exemplary embodiment.

FIG. 4 is a cross-sectional view of an OLED display according to another exemplary embodiment.

The embodiment of FIG. 1 is related to the OLED display having the top gate-type TFT 100. In the embodiment of FIG. 4, a TFT 100' of the OLED display is a bottom gate-type TFT.

Referring to FIG. 4, when a gate electrode 120' includes the TFT 100' formed below an active layer 110', a lower electrode 310' of a photo sensor 300' and the first partition wall layer 410 may be formed from the same material layer as the gate electrode 120'. For example, the lower electrode 310' of a photo sensor 300', the first partition wall layer 410, and the gate electrode 120' may include a metal layer formed of Ag, Mg, Al, Pt, Pd, Au, Ni, Nd, Ir, Cr, AlNiLa or compound of any of these. Unlike the OLED display of the embodiment of FIG. 1, an upper electrode 330' of the photo sensor 300' may be formed as a thin metal layer.

In the OLED display of the embodiment of FIG. 4, the partition wall 400 also at least partially surrounds the photo sensor 300', thus, the photo sensor 300' may have a sufficient amount of light to be absorbed by the photo sensor 300. Also, since the lower electrode 310' is a reflective layer including metal and is larger than a light-absorbing layer 320′, light-absorption efficiency of the light-absorbing layer 320′ may be increased by reflectance by the lower electrode 310′.

As described above, according to at least one of the disclosed embodiments, the OLED display may have the photo sensor with improved sensing efficiency.

It should be understood that the exemplary embodiments described therein should be considered in a descriptive sense only and not for purposes of limitation. Descriptions of features or aspects within each embodiment should typically be considered as available for other similar features or aspects in other embodiments.

While the inventive technology has been described with reference to the figures, it will be understood by those of ordinary skill in the art that various changes in form and details may be made therein without departing from the spirit and scope as defined by the following claims.

What is claimed is:

1. An organic light-emitting diode (OLED) display, comprising:
    a substrate comprising an emission area, a sensor area, and an opening area;
    a thin-film transistor (TFT) disposed over the substrate and comprising an active layer, a gate electrode, a source electrode, and a drain electrode;
    an OLED disposed in the emission area of the substrate, wherein the OLED comprises i) a pixel electrode connected to one of the source electrode and the drain electrode, ii) an intermediate layer disposed on the pixel electrode and comprising an organic emission layer, and iii) an opposite electrode disposed over the intermediate layer and configured to reflect light emitted from the intermediate layer such that the emitted light moves toward the substrate and is externally emitted via the opening area of the substrate that is adjacent to the emission area;
    a photo sensor disposed in the sensor area of the substrate; and
    a partition wall located at opposing sides of the photo sensor, wherein the partition wall is configured to reflect at least a portion of the light moving toward the substrate to the photo sensor, and
    wherein the photo sensor comprises a lower electrode, a light-absorbing layer disposed over the lower electrode, and an upper electrode disposed over the light-absorbing layer.

2. The display of claim 1, wherein the emission area and the opening area do not overlap each other.

3. The display of claim 1, wherein each of the pixel electrode and the opposite electrode is a reflective electrode.

4. The display of claim 1, wherein the photo sensor is located below a gate insulating layer.

5. The display of claim 1, wherein the lower electrode is larger in area than the light-absorbing layer.

6. The display of claim 5, wherein the lower electrode comprises at least partially of a reflective metal material configured to reflect a portion of light that travels toward the photo sensor after being emitted from the intermediate layer toward the light-absorbing layer.

7. The display of claim 1, wherein the upper electrode is located on the same layer as the active layer of the TFT.

8. The display of claim 7, wherein the active layer comprises a channel region, a source region and a drain region, wherein the source region and the drain region are disposed respectively on both sides of the channel region and are doped with ion impurities, and wherein the upper electrode comprises the same material layer as the source region and the drain region of the active layer.

9. The display of claim 1, wherein the lower electrode is located on the same layer as the gate electrode and comprises the same material as the gate electrode.

10. The display of claim 1, wherein the partition wall comprises:
    a first partition wall layer; and
    a second partition wall layer disposed over the first partition wall layer.

11. The display of claim 10, wherein the first partition wall layer is located on the same layer as the gate electrode of the TFT, and comprises the same material as the gate electrode of the TFT, and wherein the second partition wall layer is located on the same layer as the source electrode and the drain electrode, and comprises the same material layer as the source electrode and the drain electrode.

12. The display of claim 1, wherein the sensor area is disposed adjacent to the opening area.

13. The display of claim 1, wherein the sensor area and the opening area are disposed on both sides of the emission area, respectively.

14. An organic light-emitting diode (OLED) display, comprising:
    a substrate comprising an emission area, a sensor area, and an opening area;
    an OLED disposed in the emission area of the substrate, wherein the OLED comprises a pixel electrode and an opposite electrode, and an organic light emitting layer interposed between the pixel and opposite electrodes, wherein the opposite electrode is configured to first reflect light emitted from the intermediate layer such that the emitted light is externally emitted via the opening area of the substrate that is adjacent to the emission area;
    a photo sensor disposed in the sensor area of the substrate; and
    a partition wall located at opposing sides of the photo sensor,
    wherein the partition wall is configured to second reflect at least a portion of the first reflected light, and wherein the photo sensor is configured to at least partially absorb the second reflected light, and
    wherein the photo sensor comprises a lower electrode, a light-absorbing layer disposed over the lower electrode, and an upper electrode disposed over the light-absorbing layer.

15. The display of claim 14, wherein the emission area and the opening area do not overlap each other.

16. The display of claim 14, wherein the partition wall comprises:
    a first partition wall layer; and
    a second partition wall layer disposed over the first partition wall layer.

17. The display of claim 14, wherein at least a portion of the photo sensor is located between the partition wall and another adjacent partition wall.

18. The display of claim 1, further comprising a gate insulating layer covering top and side surfaces of the photo sensor, wherein the partition wall is placed on the gate insulating layer.

19. The display of claim 1, wherein the partition wall is formed on the same side of the pixel electrode.

* * * * *